(12) United States Patent
Takahashi

(10) Patent No.: US 7,848,073 B2
(45) Date of Patent: Dec. 7, 2010

(54) POWER SUPPLY CONTROLLER

(75) Inventor: Seiji Takahashi, Yokkaichi (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 748 days.

(21) Appl. No.: 11/785,861

(22) Filed: Apr. 20, 2007

(65) Prior Publication Data
US 2007/0247765 A1 Oct. 25, 2007

(30) Foreign Application Priority Data
Apr. 24, 2006 (JP) .............................. 2006-119402

(51) Int. Cl.
*H02H 3/08* (2006.01)
*H02H 9/08* (2006.01)
(52) U.S. Cl. .................... 361/93.2; 361/93.1; 361/93.9
(58) Field of Classification Search ................ 361/93.1, 361/93.2, 93.9
See application file for complete search history.

(56) References Cited

U.S. PATENT DOCUMENTS

| | | | | |
|---|---|---|---|---|
| 5,453,669 A | * | 9/1995 | Nishibe et al. | .............. 318/434 |
| 6,087,782 A | * | 7/2000 | Majid et al. | ................. 315/224 |
| 7,177,130 B2 | * | 2/2007 | Ohshima | .................... 361/93.9 |
| 7,605,573 B2 | * | 10/2009 | Nishida | ...................... 323/282 |

FOREIGN PATENT DOCUMENTS

| | | |
|---|---|---|
| DE | 10 2006 061 183 A1 | 7/2007 |
| EP | 1 393 443 B1 | 3/2004 |
| JP | A 2001-217696 | 8/2001 |
| JP | A-2003-87959 | 3/2003 |

\* cited by examiner

*Primary Examiner*—Stephen W Jackson
*Assistant Examiner*—Zeev Kitov
(74) *Attorney, Agent, or Firm*—Oliff & Berridge, PLC

(57) ABSTRACT

One aspect of the present invention is directed to a power supply controller that includes a switching element disposed between a power source and a load, a current detecting element connected to the switching element and capable of outputting a detection signal in the form of a load current to the switching element, a voltage generator circuit capable of supplying an output voltage between the switching element and the load, an anomaly detecting circuit capable of outputting an abnormal signal when the load current exceeds a threshold current such that the threshold current corresponds to the output voltage. The present invention can further include a protection circuit capable of performing a predetermined protection operation based on the abnormal signal, a control circuit capable of receiving an on signal and an off signal, wherein the control circuit turns on the switching element when receiving the on signal and turns off the switching element when receiving the off signal, and a blocking circuit capable of blocking the predetermined protection operation when the off signal is received.

12 Claims, 10 Drawing Sheets

FIG.6

| Counter value | bit0 | bit1 | bit2 | bit3 | bit4 | bit5 |
|---|---|---|---|---|---|---|
| $0 \leq m < 8$ | Lo | Hi | Hi | Hi | Hi | Hi |
| $8 \leq m < 16$ | Hi | Lo | Hi | Hi | Hi | Hi |
| $16 \leq m < 32$ | Hi | Hi | Lo | Hi | Hi | Hi |
| $32 \leq m < 64$ | Hi | Hi | Hi | Lo | Hi | Hi |
| $64 \leq m < 128$ | Hi | Hi | Hi | Hi | Lo | Hi |
| $128 \leq m$ | Hi | Hi | Hi | Hi | Hi | Lo |

POWER SUPPLY CONTROLLER

CROSS REFERENCE TO RELATED APPLICATION

This application claims priority from Japanese Patent Application No. 2006-119402 filed Apr. 24, 2006. The entire content of this priority application is incorporated herein by reference.

TECHNICAL FIELD

The present disclosure relates to a power supply controller.

BACKGROUND

Power supply controllers have been provided in which a semiconductor switching element for high power, for example a power MOSFET, is provided on a conduction channel between a power source and a load, and power supply to the load is controlled by turning on and off the switching element. Such power supply controllers having a self protection function are known. The self protection function controls the electric potential of a control terminal of the switching element and turns off the switching element if an overcurrent flows through the conduction channel, thereby protecting the switching element itself. Specifically, in a self protection function, such as the one described in Japanese Patent Laid-Open No. 2001-217696, a current detecting resistor is connected with a load terminal (for example the source or drain of a MOSFET) in series, a load current flowing through the switching element is detected on the basis of a voltage drop at a resistor and, if the load current exceeds a predetermined threshold, it is determined that an overcurrent has occurred. An electric current shutoff based on the self-protection function is designed in such a manner that the switching element automatically returns to the on state upon expiration of a predetermined after shutoff time period. This is because this function is provided in order to avoid overheat of the switching element itself, and as such, a heat sink provided for that purpose quickly decrease the temperature of the switching element after the abnormal current is shut off.

In a case where detection of an abnormal overcurrent is attempted by comparing a load current that flows to a switching element with the above described threshold, during the process from the time the switching element is turned on until it enters a stable state, a current flowing to that switching element varies along a predetermined load line. Therefore, when the aforementioned threshold is set at a constant level, there is a problem that, depending on the case, some time is required from occurrence of the abnormal overcurrent until detection thereof. For example, FIG. 10 is a view illustrating a flowing current Id and a voltage Vds between the drain and source of a power MOSFET as the above described switching element. If the load is in a normal state, by turning this power MOSFET on, the value of the current Id and the voltage Vds between the drain and source varies along the load line L0 from the point B0, and is stable at the time that it arrives at a stable point A0.

However, when an abnormal overcurrent such as a short-circuit of a load occurs, by turning on the power MOSFET, regarding the value of the current Id and the voltage Vds between the drain and the source, even if the value initially starts from the point B0, since a voltage drop for that load is extremely small the source voltage of the power MOSFET increases very little. More specifically, the current Id flowing through the power MOSFET rises rapidly in a state in which the voltage Vds between the drain and the source of the power MOSFET does not vary greatly. On the other hand, when the aforementioned threshold is set at a constant level, in other words, when a single threshold is used to detect abnormal overcurrents that may occur at each step from the time the power MOSFET is turned on until the current reaches a stable state, in order to detect an abnormal overcurrent after the stable point A0 is reached, it is necessary to set the aforementioned threshold to a constant level that is greater than the current Id that corresponds to the stable point A0 (indicated by a line L7 in the figure). In that case, when a short-circuit occurs immediately after the power MOSFET is turned on, as shown by a line L6, a certain amount of time is taken until the current reaches the threshold and the power loss at the power MOSFET is large and protection can not be attempted in that period.

SUMMARY

One aspect of the present invention is directed to a power supply controller that includes a switching element disposed between a power source and a load, a current detecting element connected to the switching element and capable of outputting a detection signal in the form of a load current to the switching element, a voltage generator circuit capable of supplying an output voltage between the switching element and the load, an anomaly detecting circuit capable of outputting an abnormal signal when the load current exceeds a threshold current such that the threshold current corresponds to the output voltage. The present invention can further include a protection circuit capable of performing a predetermined protection operation based on the abnormal signal, a control circuit capable of receiving an on signal and an off signal, wherein the control circuit turns on the switching element when receiving the on signal and turns off the switching element when receiving the off signal, and a blocking circuit capable of blocking the predetermined protection operation when the off signal is received.

In this connection, in the present invention, the term "output voltage of a switching element" refers to, for example, a source voltage when a power MOSFET as a switching element is an N-channel power MOSFET, and to a drain voltage when the power MOSFET is a P-channel power MOSFET.

According to the present invention, since a configuration is adopted that prevents execution of a protection operation by a protection circuit when a switching element is turned off by input of an off signal, it is possible to inhibit the occurrence of a case in which a protection operation is executed in error due to a surge voltage of an L load (inductive load) despite the fact that an abnormal current due to a load short-circuit or the like has not actually occurred.

BRIEF DESCRIPTION OF THE DRAWINGS

Illustrative aspects in accordance with the invention will be described in detail with reference to the following figures wherein:

FIG. 6 is a table showing association between counter values of a fuse time counter and bit signals;

DETAILED DESCRIPTION

One embodiment according to the present invention will be described with reference to FIGS. 1 to 9.

Configuration of Power Supply Controller

Figure 1:
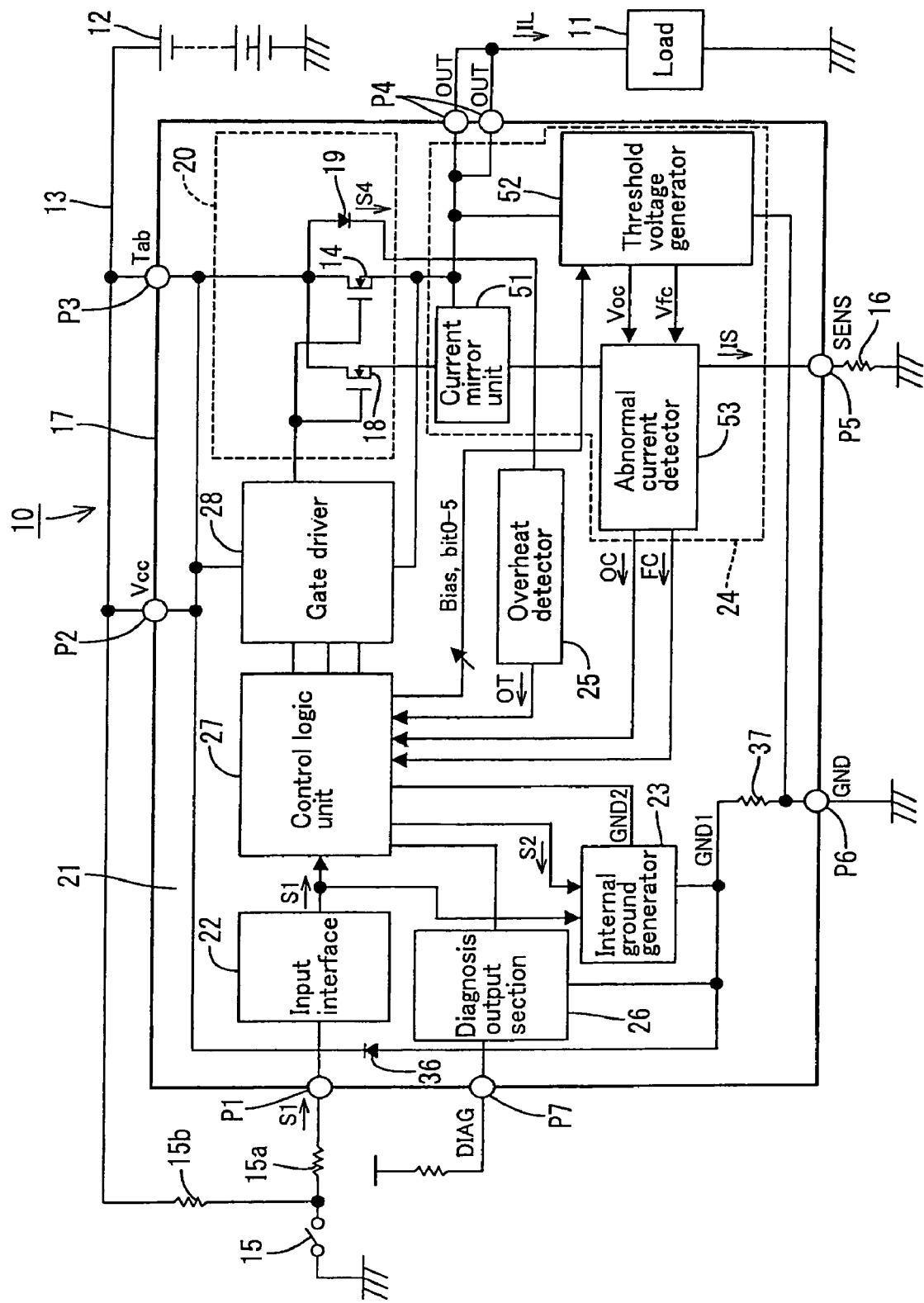
FIG. 1 is a block diagram showing an overall configuration of a power supply controller according to one illustrative aspect of the invention.

FIG. 1 is a block diagram showing an overall configuration of a power supply controller 10 according to one embodiment of the present invention. The power supply controller 10 is provided in a vehicle, not shown, and controls power supply from an on-vehicle power source (hereinafter referred to as the "power source 12") to a load 11. The load 11 may be a vehicle lamp, a cooling fan motor, a defogger heater, or the like. The term "load" as used in the following description means a device under the control of the power supply controller 10, excluding a wire 30 between the power supply controller 10 and the device under control. The term "external circuit" as used herein means a circuit including the load 11 and the wire 30.

Specifically, the power supply controller 10 includes a power MOSFET 14 (an example of a "switching element") provided in a conduction channel 13 from a power source 12 to a load 11. The power supply controller 10 provides a control signal S1 such as a constant voltage signal or a PWM (Pulse Width Modulation) control signal to the gate of the power MOSFET 14 to turn on and off the MOSFET 14, thereby controlling power supply to the load 11, which is led to the output of the power MOSFET 14. In this embodiment, the power supply controller 10 has an input terminal P1, which is connected to an external operation switch 15. When the switch 15 is turned on, the power supply controller 10 is activated. In particular, the input terminal P1 is connected to the operation switch 15 through a resistor 15a, and a connection point between the resistor 15a and the operation switch 15 is connected to the power source 12 through a resistor 15b. The input terminal P1 is pulled up to a power supply voltage Vcc when the operation switch 15 is in the off state.

As shown in FIG. 1, the power supply controller 10 is implemented as a semiconductor switching device 17 (semiconductor device) that includes the input terminal P1, a power supply (Vcc) terminal P2 and a tab terminal P3 connected to the power source 12, a load connection terminal P4 connected to the load 11, an external terminal P5 connected to a ground (GND) through an external resistor 16 which is a current-voltage converter circuit, a ground terminal P6 directly connected to the ground (GND), and a diagnosis output terminal P7. In this illustrative aspect, the power MOSFET 14, a sense MOSFET 18 (an example of a "current detecting element"), which will be described later, and a temperature sensor 19 (for example a diode) which is a temperature detecting element are integrated into one chip, a power chip 20, which is then integrated into a control chip 21.

Figure 3:
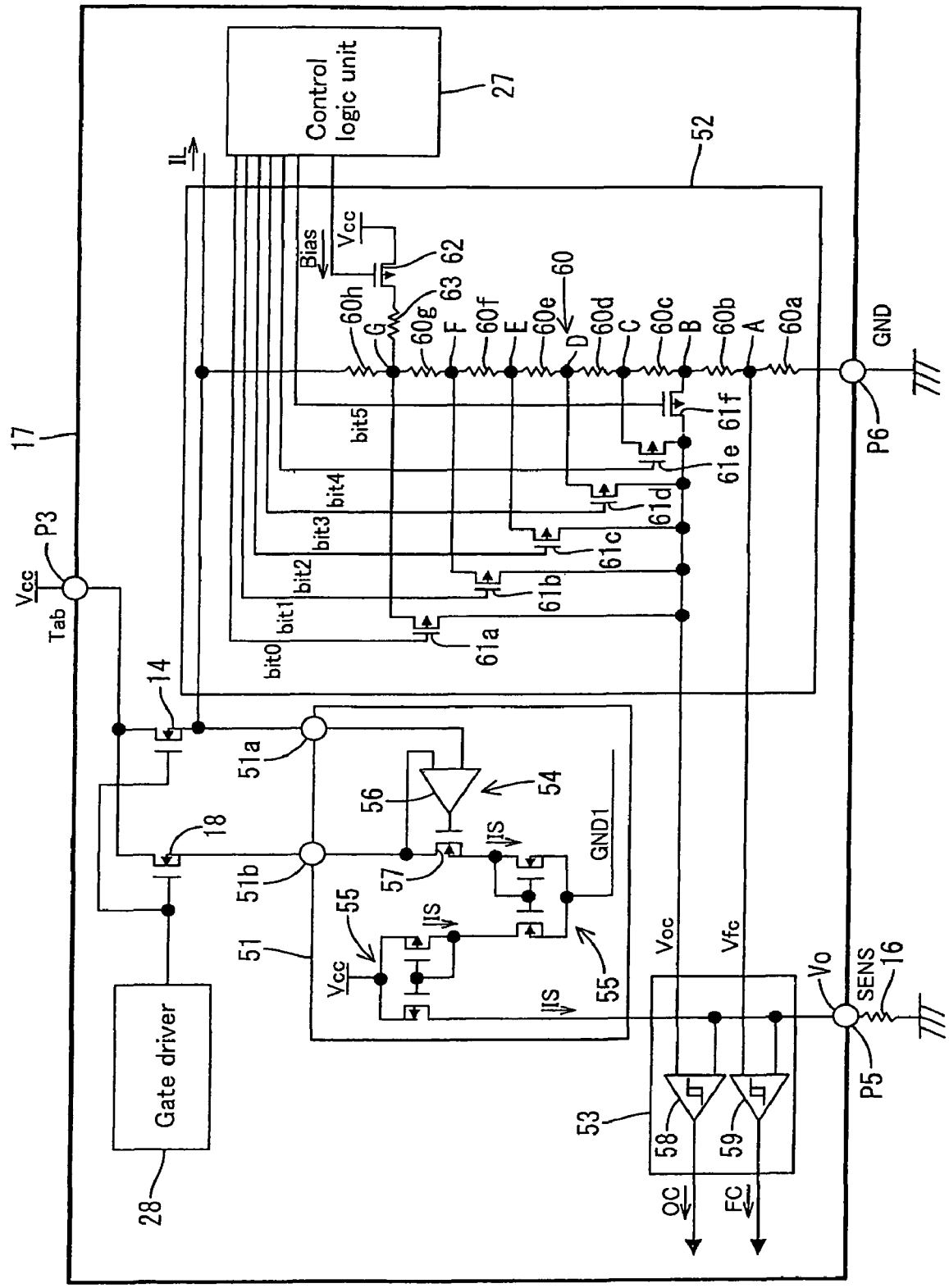
FIG. 3 is a schematic circuit diagram of a current mirror unit, a threshold voltage generator, and an abnormal overcurrent detector.

As shown in FIG. 3, in the power chip 20, multiple MOSFETs whose drains are connected in common to the tab terminal P3 are arranged, most of which constitute a power MOSFET 14 whose sources are connected in common to a power FET input 51a of a current mirror unit 51, which will be described later, and the load connection terminal P4, and the rest of the MOSFETs constitute a sense MOSFET 18 whose sources are connected in common to a sense FET input 51b of the current mirror unit 51. The ratio of the number of MOSFETs constituting the power MOSFET 14 to the number of the MOSFETs constituting the sense MOSFET 18 is approximately equal to the sense ratio.

Provided on the control chip 21 are an input interface 22, an internal ground generator 23, a current detector 24, an overheat detector 25, a diagnosis output section 26, a control logic unit 27, and a gate driver 28.

As shown in FIG. 1, between the power supply terminal P2 and the ground terminal P6, a diode 36 in which a cathode side is disposed on a high-voltage side and a resistor 37 are serially connected, and a connection point between these components constitutes the above described internal ground GND1. With this kind of configuration, even when the ground terminal P6 side is erroneously connected to the power supply voltage Vcc side, a current flowing inside the circuit of the power supply controller 10 can be regulated to a level under or equal to a constant level by the diode 36.

Input Interface

The input of the input interface 22 is connected to the input terminal P1. When the operation switch 15 is turned off, a high-level control signal S1 is inputted; when the operation switch 15 is turned on, a low-level control signal S1 is inputted. The control signal S1 is provided to the internal ground generator 23 and the control logic unit 27. As will be described later, the power supply controller 10 controls the gate driver 28 to turn on the power MOSFET 14 in response to the low-level control signal S1 in a normal state in which neither an abnormal current nor an abnormal temperature is generated. On the other hand, in response to the high-level control signal S1, the power supply controller 10 controls the gate driver 28 to turn off the power MOSFET 14 to place it in the shutoff state. Accordingly, the low-level control signal S1 is an example of an "on signal", the high-level control signal S1 is an example of a "(first) off signal", and the gate driver 28 functions as a "control circuit".

Internal Ground Generator

The internal ground generator 23 (an example of the "power supply circuit") is in conduction and is generating an internal ground GND2 that is lower than the power supply voltage Vcc by a predetermined amount of voltage while the internal ground generator 23 is receiving one of the low-level control signal S1 (on signal) from the input interface 22 and a low-level signal S2 outputted from a clear counter 72 (the state where the clear counter 72 is not overflowing), which will be described later. In other words, the internal ground generator 23 remains in conduction and continue generating the internal ground GND2 as long as it is receiving the low-level output signal S2 from the clear counter 72 even if it receives the high-level control signal S1 (off signal) from the input interface 22. A constant voltage that is the power supply voltage Vcc minus the internal ground GND2 is supplied to the control logic unit 27 to place the control logic unit 27 in a operational state.

Figure 2:
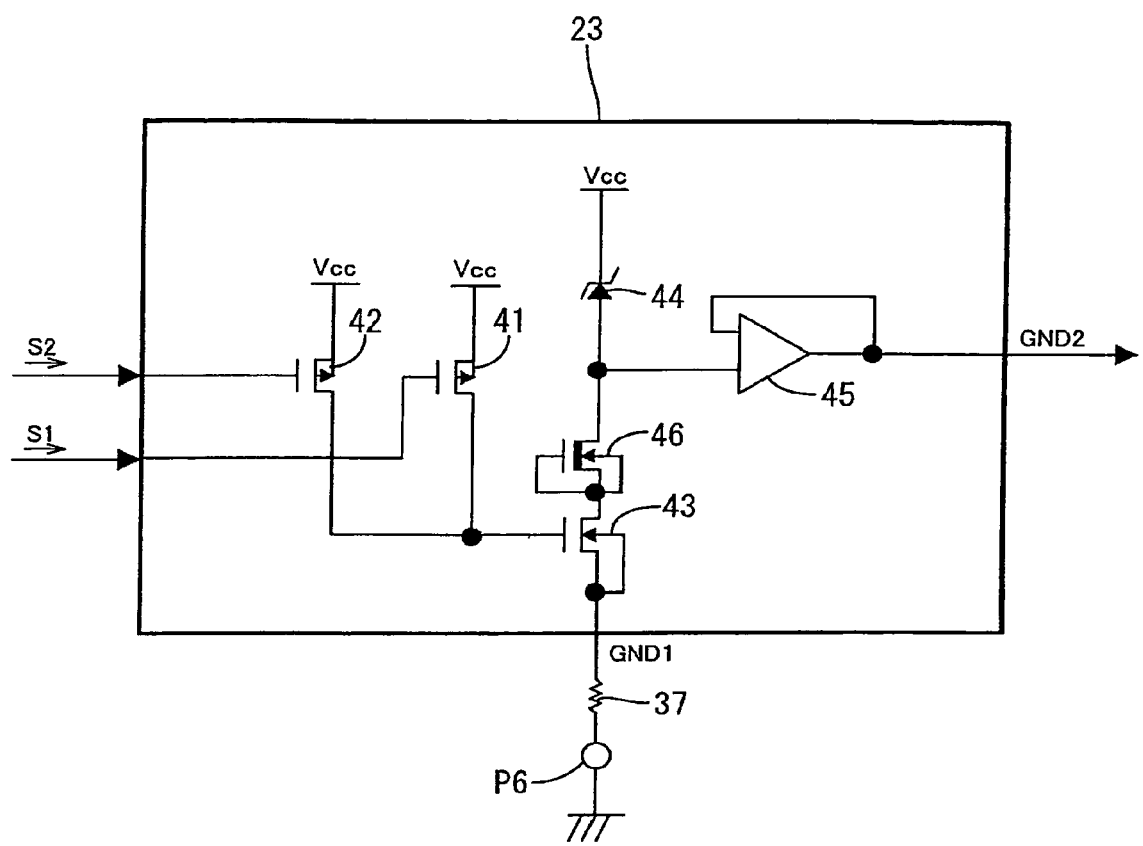
FIG. 2 shows a schematic circuit diagram of an internal ground generator.

In particular, the internal ground generator 23 includes a FET 41, which is an switching element that is turned on in response to the low-level control signal S1 (on signal) and a FET 42, which is a switching element that is turned on in response to the low-level output signal S2, as shown in FIG. 2. The outputs of these FETs 41, 42 are connected to a control terminal of another FET 43 which is a switching element. The input (drain) of the FET 43 is connected to the power supply terminal P2 through a Zener diode 44 and the output (source) is connected to the ground terminal P6 through the resistor 37.

When the low-level control signal S1 or the low-level output signal S2 is inputted in the internal ground generator 23, the FET 43 turns on to bring the internal ground generator 23 in conduction and the internal ground generator 23 generates the internal ground GND2 lower than the power supply voltage Vcc by an amount equal to a Zener voltage of the Zener diode 44, which is provided to the control logic unit 27 through an operational amplifier 45 in voltage follower connection. In this embodiment, a FET 46 whose source and gate are shorted with each other is connected into the conduction channel along which the Zener diode 44 and FET 43 are connected, so that a constant current flows through the Zener diode 44 while the FET 43 is in the on state, thereby further stabilizing the internal ground GND2.

Current Detector

The current detector 24 includes a current mirror unit 51, a threshold voltage generator 52, and an abnormal overcurrent detector 53 as shown in FIG. 1. FIG. 3 is an enlarged view of the circuitry including the current mirror unit 51, the threshold voltage generator 52, and the abnormal current detector 53. Some of the other circuit components are omitted from FIG. 4.

a. Current Mirror Unit

The current mirror unit 51 includes a potential control circuit 54 for maintaining the output potentials (source potentials) of the power MOSFET 14 and the sense MOSFET 18 at an identical level and a pair of current mirror circuits 55.

The potential control circuit 54 includes an operational amplifier 56 having a pair of input terminals to which the power FET input 51a (the source of the power MOSFET 14) and the sense FET input 51b (the source of the sense MOSFET 18) are connected, and a FET 57 which is a switching element which is connected between the sense FET input 51b and the external terminal P5 and has a control terminal to which an output from the operational amplifier 56 is provided. More specifically, the power FET input 51a is connected to the inverting input of the operational amplifier 56 and the sense FET input 51b is connected to the non-inverting input of the operational amplifier 56. The differential output of the operational amplifier 56 is fed back to the non-inverting input through the gate-drain of the FET 57.

By feeding back the differential output of the operational amplifier 56, an imaginary short state occurs where the potentials of the inverting and non-inverting inputs of the operational amplifier 56 are approximately the same. Consequently, the potential of the drain of the power MOSFET 14 and that of the sense MOSFET 18 become identical and the potentials of their sources also become identical to each other. Therefore, a sense current Is (an example of a "detection signal from the current detecting element") with a stable constant ratio to the load current IL flowing through the power MOSFET 14 (the sense ratio mentioned above) can be passed through the sense MOSFET 18.

The sense current Is from the potential control circuit 54 flows to the external resistor 16 through the pair of current mirror circuits 55 and the external terminal P5. The terminal voltage Vo at the external terminal P5 varies according to the sense current Is.

b. Abnormal Overcurrent Detector

The abnormal current detector 53 (an example of an "anomaly detecting circuit") includes one or multiple (two in the present illustrative aspect) comparators 58, 59 (hysteresis comparators in the present illustrative aspect). The terminal voltage Vo at the external terminal P5 is provided to one of the input terminals of the comparator 58 and to one of the input terminals of the comparator 59.

The comparator 58 receives at the other input terminal a first anomaly threshold voltage Voc from the threshold voltage generator 52 and, if the terminal voltage Vo exceeds the first anomaly threshold voltage Voc, outputs a low-level first abnormal current signal OC (an example of an "abnormal signal") to the control logic unit 27. Hereinafter a load current IL that flows through the power MOSFET 14 at the time of the abnormal current in which the terminal voltage Vo reaches the first anomaly threshold-voltage Voc is referred to as a "first anomaly threshold current ILoc (an example of an "threshold current")" and the abnormal current can be referred to as an "overcurrent".

The comparator 59 receives at the other input terminal a second anomaly threshold voltage Vfc (<Voc) from the threshold voltage generator 52 and, if the terminal voltage Vo exceeds the second anomaly threshold voltage Vfc, outputs a low-level second abnormal current signal FC (an example of the "abnormal signal") to the control logic unit 27. Hereinafter, the load current IL that flows through the power MOSFET 14 at the time of the abnormal current in which the terminal voltage Vo reaches the second anomaly threshold voltage Vfc is referred to as a "second anomaly threshold voltage ILfc (an example of an "threshold current")" and the abnormal current is referred to as a "fuse current".

c. Threshold Voltage Generator

The threshold voltage generator 52 (an example of a "voltage generator circuit") includes a voltage divider circuit which divides a reference voltage by using multiple resistors and is capable of changing the anomaly threshold voltage to be provided to the abnormal overcurrent detector 53 by changing a selected one of the partial voltages generated by the voltage divider circuit. In particular, the threshold voltage generator 52 includes a voltage divider circuit 60 connected between the source of the power MOSFET 14 and the ground terminal P6 as shown in FIG. 3. The voltage divider circuit 60 includes multiple resistors (eight resistors 60a-60h in the present illustrative aspect) connected in series and outputs the partial voltage at the connection point A between the resistors 60a and 60b as the second anomaly threshold voltage Vfc (an example of a "generation voltage").

The threshold voltage generator 52 also includes multiple FETs 61a-61f functioning as switching elements that enable the other input terminal of the comparator 58 to be selectively connected to one of the connection points B-G of resistors 60b-60h. By selectively turning on FETs 61a to 61f in sequence, the level of the first anomaly threshold voltage Voc (an example of a "generation voltage") can be gradually decreased. Each of FETs 61a-61f is turned on and off by the control logic unit 27 as will be described later.

While the voltage divider circuit 60 according to the present illustrative aspect divides the source voltage Vs of the power MOSFET 14, it may divide a predetermined voltage other than the source voltage. However, the configuration according to the present illustrative aspect can set each anomaly threshold voltage in such a manner that it changes in accordance with variations in the source voltage Vs of the power MOSFET 14. Therefore, as compared with the configuration that sets a fixed threshold regardless of variations in the source voltage, the configuration according to the present illustrative aspect enables an abnormal current to be detected quickly because if a short-circuit of the load 11 occurs, for example, the terminal voltage Vo of the external resistor 16 immediately reaches the anomaly threshold voltage regardless of the level of the power supply voltage Vcc. Furthermore, in the present illustrative aspect, in order to apply a bias to prevent the source voltage Vs from decreasing to 0 V when the power MOSFET 14 is in the off state, a current from the power source 12 is flown through the voltage divider circuit 60 through a resistor 63 by using an FET 62 functioning as a switching element that turns on in response to a bias signal, Bias, from the control logic unit 27. The bias signal, Bias, is outputted from the control logic unit 27 to turn on the FET 62 when a low-level control signal S1 or a low-level output signal S2 is provided.

More specifically, in FIG. 5 that is described later, an AND circuit 69 into which the control signal S1 and the output signal S2 from the clear counter 72 are inputted is provided in the control logic unit 27, and the aforementioned bias signal, Bias, is outputted from the AND circuit 69.

Figure 4:
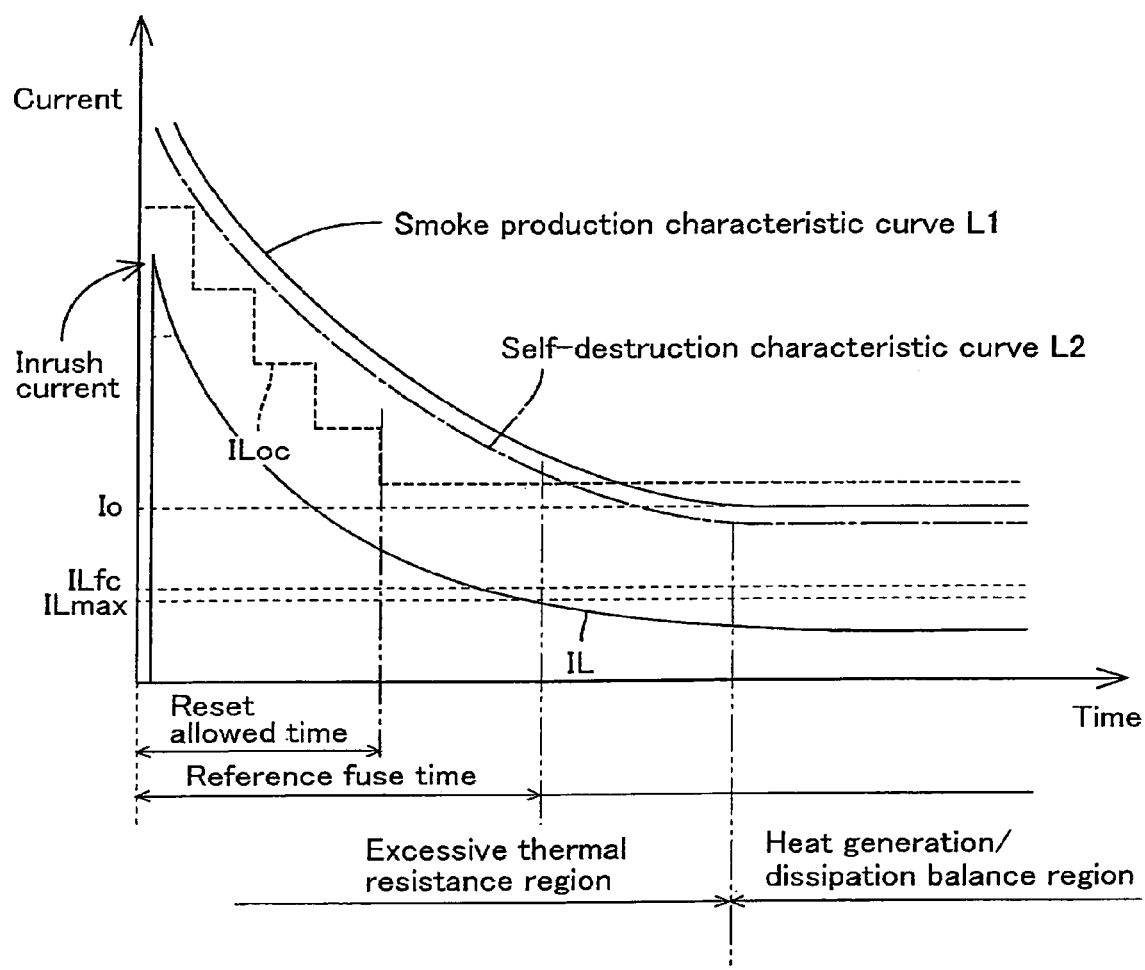
FIG. 4 is a graph for illustrating set levels of first and second anomaly threshold currents.

FIG. 4 is a graph illustrating set levels of the first anomaly threshold current ILoc and second anomaly threshold current ILfc. Shown in this graph is a smoke production characteristic curve L1 representing the smoke production characteristic of a wile 30 (for example a wire coating material) that can be connected to the power supply controller 10 in terms of the relationship between a steady-state current level and energizing time (meltdown time). That is, the smoke production characteristic curve L1 represents the relationship between a given constant current (one-shot current) and the time elapsing from the start of passage of the current through the wire 30 to the occurrence of burnout of the coating material of the wire 30. Also shown in the graph is a self-destruction characteristic curve L2 representing the relationship between a given constant current (one-shot current) and the time elapsing the start of passage of that current through the power MOSFET 14 to the breakage of the power MOSFET 14. The second anomaly threshold current ILfc is set within a region where the current level is below the smoke production characteristic curve L1 and the self-destruction characteristic curve L2. The first anomaly threshold current ILoc is set within a region where the current level is below the smoke production characteristic curve L1 and the self-destruction characteristic curve L2 in a time period shorter than a reference fuse time, which will be described later, that starts when a fuse time counter 73 starts counting up from the initial value.

The graph shows the smoke production characteristics of one wire 30 selected from among wires 30 that can be connected to the power supply controller 10. The smoke production characteristic varies depending on the external circuit (materials for wiring and the load) connected to the power supply controller 10, and, accordingly, including load current IL and sense current Is that flow when the abnormal current signals FC and OC are outputted. However, these variations can be readily accommodated by changing the resistance value of the external resistor 16 mentioned above.

In the graph, ILmax denotes the rated current (the designer's guaranteed allowable maximum current that a device can carry) of the load 11 and Io denotes the maximum allowable current in balance that can be flown through the wire 30 in a state where heat generation and dissipation are in balance. When a current at a level higher than the maximum allowable current in balance Io, an excessive thermal resistance region is entered in which the current level and the time elapsing from the passage of the current to burnout are substantially in inverse proportion. In the second anomaly threshold current ILfc is set to a level slightly higher than the rated current ILmax of the load 11 as shown in FIG. 4. The comparator 59 detects a fuse current flowing at the time the load current IL has reached the second anomaly threshold current ILfc and outputs the second abnormal current signal FC. If the load current IL is approximately equal to the second anomaly threshold current ILfc, the power MOSFET 14 does not need to be immediately turned off; it may be turned off after the fuse current state persists for a certain time as will be described later.

On the other hand, the first anomaly threshold current ILoc is set at a level higher than the second anomaly threshold current ILfc. The comparator 58 detects an overcurrent flowing at the time the load current IL has reached the first anomaly threshold current ILoc and outputs the first abnormal current signal OC. When the load current IL exceeds the first anomaly threshold current ILoc, the power MOSFET 14 must be immediately turned off, as will be described later. The threshold voltage generator 52 initially sets, in preparation for an inrush current, the first anomaly threshold current ILoc to an initial level higher than the inrush current and, when a fuse current is detected, gradually reduces the level with time as shown in FIG. 4.

Overheat Detector

The overheat detector 25 receives a temperature signal S4 corresponding to the temperature of the power chip 20 from a temperature sensor 19 provided on the power chip 20. When the overheat detector 25 receives a temperature signal S4 indicating an abnormal temperature that exceeds a predetermined temperature threshold, the overheat detector 25 detects the temperature anomaly and provides a low-level, abnormal temperature signal OT (an example of the "abnormal signal") to the control logic unit 27.

The diagnosis output section 26 pulls down the diagnosis output terminal P7 to a low level and provides a diagnosis output in response to a high-level, diagnosis signal (DIAG.) from the control logic unit 27 when an abnormal current or temperature occurs (as will be described later) and the control logic unit 27 causes the power MOSFET 14 to perform first and second forced shutoff operations, which will be described later. Thus, the fact that the power MOSFET 14 is in the forced shutoff state due to the occurrence of abnormal current or temperature or activation of fuse function can be notified to the outside.

Control Logic Unit

Figure 5:
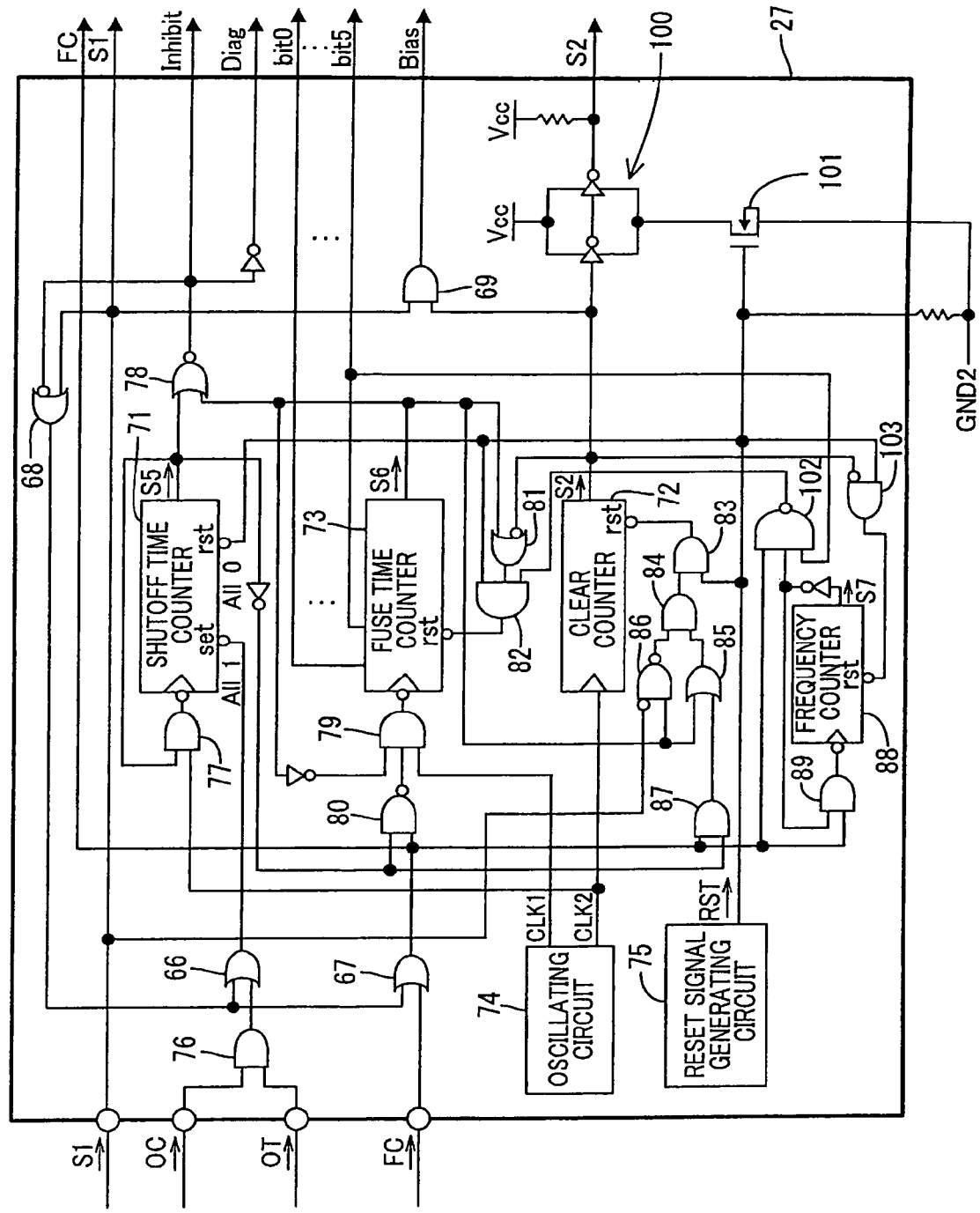
FIG. 5 is a schematic circuit diagram of a control logic unit.

FIG. 5 is a schematic circuit diagram of the control logic unit 27. The control logic unit 27 includes a shutoff time counter 71, a clear counter 72, a fuse time counter 73, an oscillating-circuit 74, a reset signal generating circuit 75 and counter 88. The control logic unit 27 receives the control signal S1 from the input interface 22, the first abnormal current signal OC and second abnormal current signal FC from the current detector 24, and the abnormal temperature signal OT from the overheat detector 25.

a. Oscillating Circuit and Reset Signal Generating Circuit

The oscillating circuit 74 generates and outputs two clock signals CLK1 (125 μsec for example) and CLK2 (4 msec for example) having different cycles. The reset signal generating circuit 75 generates a constant voltage sufficiently high to bring the internal ground generator 23 into conduction and to cause the control logic unit 27 to operate, and continues outputting a low-level output signal RST (reset signal) until the clock generation by the oscillating circuit 74 becomes stable, and then outputs a high-level output signal RST.

b. Shutoff Time Counter

In response to at least one of the low-level first abnormal current signal OC from the current detector 24 and the low-level abnormal temperature signal OT from the overheat detector 25, the shutoff time counter 71 (an example of the "protection circuit") forces the power MOSFET 14 to shut off and be kept in the shutoff state for a predetermined reference shutoff time period (time required for counting down from "n" to "0", specifically 32 msec), and then releases the power MOSFET 14 from the forced shutoff state (an example of the "protection operation"). It should be noted that the forced shutoff in the present illustrative aspect is to bring the power MOSFET 14 into and keep in the shutoff state even if the power supply controller 10 has received a low-level control signal S1 (on signal).

In particular, the shutoff time counter 71 counts down from the initial value n to 0 in synchronization with the clock signal CLK2. The shutoff time counter 71 is designed to receive, at its reset terminal, the inverted signal of an output signal RST from the reset signal generating circuit 75. All of the n counters are kept reset to "0" (count value is reset to the initial value "n") while a low-level output signal RST is being outputted. The counters are released from the reset state in response to a high-level output signal RST. The shutoff time counter 71 outputs a low-level output signal S5 when all of the n counters are "0" (the reset state or a count value overflow state); otherwise, the shutoff time counter 71 outputs a high-level output signal 5S to force the power MOSFET 14 to shut off.

Further, an output signal from the AND circuit 76 to which a first abnormal current signal OC and an abnormal temperature signal OT are inputted is enabled in that state at the OR circuit 66 and an inverted signal thereof is inputted to a set terminal of the shutoff time counter 71. Thereby, when an overcurrent occurs and the shutoff time counter 71 receives the low-level first abnormal current signal OC as described above or when an abnormal temperature occurs and the shutoff time counter 71 receives the low-level abnormal temperature signal OT, the shutoff time counter 71 sets all of the n counters to "1". As a result, the shutoff time counter 71 outputs the high-level output signal S5 to enable the clock signal CLK2 from the oscillating circuit 74 at the AND circuit 77 and start a countdown operation at a timing that is synchronized with this clock. The shutoff time counter 71 performs the countdown at the trailing edge of each clock.

Since the high-level output signal S5 is being outputted during the time period from the start of the countdown by the shutoff time counter 71 until the shutoff time counter 71 counts down to "0" to overflow, the clock signal CLK2 is enabled at the AND circuit 77 and is inputted to the clock terminal of the shutoff time counter 71. An NOR circuit 78 receives the high-level output signal S5 and provides a low-level output signal, Inhibit, to the gate driver 28 to force the power MOSFET 14 to shut off.

After counting down to "0" and overflowing, the shutoff time counter 71 outputs a low-level output signal S5 and the input of clock signal CLK2 is disabled at the AND circuit 77. The NOR circuit 78 receives the low-level output signal S5 and provides a high-level output signal Inhibit to the gate driver 28 to release the power MOSFET 14 from the forced shutoff state. Consequently, the power MOSFET 14 returns to the conduction state if the power supply controller 10 receives a low-level control signal S1 (on signal).

Figure 7:
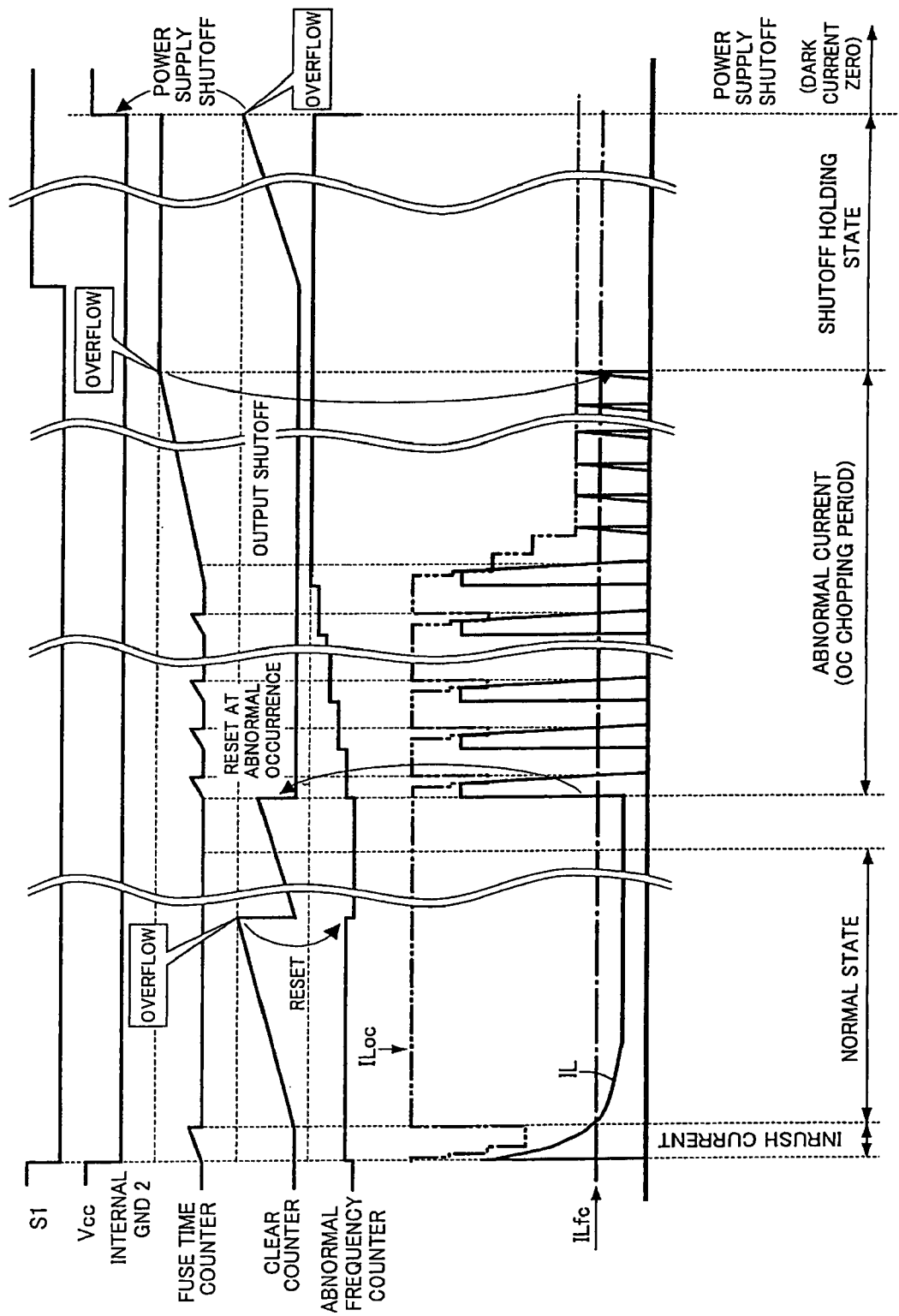
FIG. 7 is a timing chart of a control signal which is a low-level constant voltage signal received by a power supply controller.

In this way, each time an overcurrent, for example, occurs and the low-level first abnormal current signal OC is outputted from the current detector 24, the shutoff time counter 71 immediately forces the power MOSFET 14 to shutoff and, after the countdown of n, releases the power MOSFET 14 from the forced shutoff state, as shown in FIG. 7 (see the OC chopping period). Hereinafter, the forced shutoff caused by the shutoff time counter 71 in which the MOSFET 14 is held in a shutoff state for a predetermined reference shutoff time period and then returns to the conduction state is called the "first forced shutoff".

c. Fuse Time Counter

The fuse time counter 73 (an example of an "anomaly time accumulating circuit") accumulates the amount of anomaly time (hereinafter referred to as "fuse time") during which it is receiving a low-level second abnormal current signal FC from the current detector 24 and the amount of anomaly time during which the power MOSFET 14 is kept in the forced shutoff state by the shutoff time counter 71. When the accumulated amount of time reaches a predetermined reference fuse time (which is shorter than the reference shutoff time and is the time required for counting up from "0" to m (>n), specifically 1,024 msec, and is an example of "reference anomaly time"), the fuse time counter 73 forces the power MOSFET 14 to shutoff (an example of the "protection operation").

In particular, the fuse time counter 73 counts up from the initial value, 0, to m in synchronization with the clock signal CLK1. The fuse time counter 73 performs the count-up at the trailing edge of each clock. More specifically, the fuse time counter 73 outputs a low-level output signal S6 during the count-up. After counting up to "m" and overflowing, the fuse time counter 73 outputs a high-level output signal S6 (an example of a "shutoff signal"). The inverted signal of the output signal S6 from the fuse time counter 73 and an output signal from a NAND circuit 80 are inputted into an AND circuit 79 for enabling the clock signal CLK1 from the oscillating circuit 74. The NAND circuit 80 outputs a high-level signal on receiving a low-level second abnormal current signal FC or on receiving a low-level signal that is the inverted signal of a high-level output signal S5 while the shutoff time counter 71 is counting down.

Further, the NAND circuit 80 receives the second abnormal current signal FC through the OR circuit 67.

Thus, the fuse time counter 73 performs count-up operation when a low-level second abnormal current signal FC is outputted or the clock signal CLK1 is enabled at the AND circuit 79 while the shutoff time counter 71 is counting down, until overflow occurs. After it counts up to "m" and overflows, the fuse time counter 73 outputs a high-level output signal S6. The NOR circuit 78 receives the high-level output signal S6 and outputs a low-level output signal, Inhibit, to the gate driver 28 to force the power MOSFET 14 to shutoff. Hereinafter the forced shutoff caused by the overflow of the fuse time counter 73 is called the "second forced shutoff". Since the high-level output signal S6 is outputted, input of the clock signal CLK1 into the fuse time counter 73 is disabled and therefore the fuse time counter 73 is kept in the overflow state. Thus, the fuse time counter 73 functions as a holding circuit.

Further, at the fuse time counter 73, the counter value is reset to the initial value "0" at the following times:

(1) when a low-level output signal RST is outputted from the reset signal generating circuit 75 (reset state);

(2) when a high-level outputted signal S2 (corresponds to a "clear signal") is outputted from the clear counter 72 (the clear counter 72 overflows) (provided, the time from when the fuse time counter 73 overflows is excluded); and (3) when a fuse current is dissipated and a high-level second abnormal current signal FC is received before a frequency counter 88, as described later, overflows (provided, the time from when the accumulated amount of fuse time reaches a reset allowed time that is described later is excluded). This reset pattern (3) will be described later.)

More specifically, the level inverted signal of the output signal S2 from the clear counter 72 and the output signal S6 of the fuse time counter 73 are inputted to the OR circuit 81, an output signal of the OR circuit 81 and the output signal RST from the reset signal generating circuit 75 are inputted to the AND circuit 82, and the level of this output signal is inverted and inputted to the reset terminal of the fuse time counter 73. Accordingly, while a low-level output signal RST is being outputted from the reset signal generating circuit 75, the counter value of the fuse time counter 73 is always reset to the initial value "0". As will be described later, an output signal from an NAND circuit 102 is also inputted into the AND circuit 82.

On the other hand, while a high-level output signal RST is being outputted from the reset signal generating circuit 75, the fuse time counter 73 is reset to the initial value "0" by a high-level output signal S2 from the clear counter 72 until the fuse time counter 73 overflows. After the fuse time counter 73 overflows, the fuse time counter 73 is not reset and the second forced shutoff state is retained even if the high-level output signal S2 is outputted from the clear counter 72.

The fuse time counter 73 sequentially outputs signals, in particular, low-level bit signals "bit 0" to "bit 5", according to the amount of time (counter value) accumulated by count-up operation, as shown in FIG. 6. Accordingly, FETs 61a to 61f in the threshold voltage generator 52 are sequentially and selectively turned on. Thus, the level of the first anomaly threshold voltage Voc (the first anomaly threshold current ILoc) can be gradually decreased in accordance with the accumulated time.

The accumulated time when the fuse time counter 73 outputs the low-level bit signal "bit 5" corresponds to "reset allowed time" (<reference fuse time; in the present illustrative aspect, for example, 16 msec). As shown in FIG. 4, this reset allowed time is set based on a time until the self-destruction characteristic curve L2 slopes gently to a certain degree.

d. Clear Counter

The clear counter 72 (corresponds to "normal time accumulating circuit") is a component that mainly resets the accumulated time (counter value) of the fuse time counter 73 to the initial value "0" during a period until overflow after the fuse time counter 73 starts a count-up operation, when a normal state in which neither an abnormal current nor an abnormal temperature as described above is generated (a state in which the load current IL has not reached the second anomaly threshold voltage ILfc and the first anomaly threshold current ILoc; the load current IL level at this time is one example of "normal level") has continued for a predetermined reference normal time (time until the count value counts down from "0" to "q"; more specifically, 512 msec). More specifically, the clear counter 72 counts up from the initial value "0" to "q (<n)" in synchrony with the clock of the above described clock signal CLK2. The clear counter 72 performs the count-up at the leading edge of each clock. The reference normal time is defined, for example, on the basis of a time until an overheat state of a load or the like dissipates after a fuse current or an overcurrent state is dissipated.

The clear counter 72 is reset to the initial value "0" when a low-level output signal RST is outputted from the reset signal generating circuit 75 (the reset state). In the period between the start of count-up by the fuse time counter 73 and its overflow, the clear counter 72 is reset when it receives a low-level second abnormal current signal FC from the current detector 24 or when the power MOSFET 14 is forcedly shut off by the shutoff time counter 71. Once the fuse time counter 73 overflows, the clear counter 72 is reset in response to a low-level control signal S1 (on signal).

In particular, the clock signal CLK2 is directly inputted from the oscillating circuit 74 to the clear counter 72 and the clear counter 72 normally outputs a low-level output signal S2. When the clear counter 72 counts up to "q" and overflows, the clear counter 72 outputs a high-level signal S2 (second off signal) equivalent to, for example, 1 clock. The output signal RST from the reset signal generating circuit 75 is inputted into an AND circuit 83, which then outputs the level-inverted signal of the output signal to the reset terminal of the clear counter 72. Thus, when the low-level output signal RST is outputted from the reset signal generating circuit 75, the counter is reset to the initial value "0".

Also inputted into the AND circuit 83 is an output signal from the AND circuit 84, to which an output signal from an OR circuit 85 and an output signal from a NAND circuit 86 are inputted. Inputted in the OR circuit 85 are an output signal from an AND circuit 87 and the output signal S6 from the fuse time counter 73. Inputted into the AND circuit 87 are the second abnormal current signal FC and the level-inverted signal of the output signal S5 from the shutoff time counter 71. With this configuration, the counter value of the clear counter 72 is reset when it receives a low-level second abnormal current signal FC or when the power MOSFET 14 is forced to shut off by the shutoff time counter 71, in a period from the start of count-up by the fuse time counter 73 to its overflow, as described above.

The output signal S6 from the fuse time counter 73 and the level-inverted signal of the control signal S1 are inputted in the NAND circuit 86. Thus, the clear counter 72 is reset when it receives the low-level control signal S1 (on signal) after the fuse time counter 73 overflows.

e. Frequency Counter

A frequency counter 88 as a threshold initialization circuit is a component that mainly executes an initialization operation that returns to the initial level a first anomaly threshold voltage Voc (first anomaly threshold current ILoc) for which the level has gradually decreased with time a maximum of x times (corresponds to "predetermined frequency"; in the present illustrative aspect, the frequency is, for example, seven times), when, after receiving a low-level second abnormal current signal FC due to a fuse current, the fuse current is dissipated and a high-level second abnormal current signal FC is received.

More specifically, the frequency counter 88 counts the number of times that the low-level second abnormal current signal FC is inputted into the control logic unit 27 until, for example, y (=x+1) times. When y is reached before overflow occurs the frequency counter 88 outputs a low-level output signal S7, and when y is reached after overflow occurs the frequency counter 88 outputs a high-level output signal S7. The level-inverted signal of the output from the AND circuit 89 is inputted into the frequency counter 88. Inputted into the AND circuit 89 are the second abnormal current signal FC and the level-inverted signal of the output signal S7 from the frequency counter 88. Further, inputted into the NAND circuit 102 are the second abnormal current signal FC, the level-inverted signal of the output signal S7 from the frequency counter 88, and the aforementioned bit signal "bit 5". The output signal from the NAND circuit 102 is provided to the aforementioned AND circuit 82.

According to this configuration, before the count value overflows, and when a high-level bit signal "bit 5" is being received from the fuse time counter 73 (when the accumulated time of the fuse time counter 73 has not reached the above described reset allowed time), the frequency counter 88 increments the count value by 1 each time a low-level second abnormal current signal FC is inputted to the AND circuit 89. At this time, inputted into the NAND circuit 102 are a low-level second abnormal current signal FC, the level-inverted high level signal of the output signal S7 from the frequency counter 88, and a high-level "bit 5" bit signal.

Subsequently, at the time that the fuse current is dissipated and a high-level second abnormal current signal FC can be inputted, a low-level output signal from the NAND circuit 102 is inputted to the AND circuit 82, and as a result, the accumulated time (counter value) of the fuse time counter 73 is reset to the initial value "0" (reset pattern (3) described in the above described "c. fuse time counter"). Thus, the above described initialization operation that returns the first anomaly threshold voltage Voc (first anomaly threshold current ILoc) to the initial level is executed.

On the other hand, when the count value of the frequency counter 88 overflows, the level-inverted low-level signal of the output signal S7 from the frequency counter 88 is inputted to the NAND circuit 102, and regardless of the second abnormal current signal FC and the high or low level of the "bit 5" bit signal, a high-level output signal from the NAND circuit 102 is inputted to the AND circuit 82 and it is no longer possible for the frequency counter 88 to reset the accumulated time of the fuse time counter 73, i.e. execute an initialization operation.

Further, even before the count value of the frequency counter 88 overflows, when a low-level bit signal "bit 5" is received from the fuse time counter 73 (when the accumulated time of the fuse time counter 73 reaches the above-described reset allowed time), regardless of the second abnormal current signal FC and the high or low level of the level-inverted signal of the output signal S7 from the frequency counter 88, a high-level output signal from the NAND circuit 102 is inputted to the AND circuit 82 and it is no longer possible for the frequency counter 88 to reset the amount of accumulated time of the fuse time counter 73, i.e. execute an initialization operation. Accordingly, the frequency counter 88 and the NAND circuit 102 function as non-resettable circuits.

The reset terminal of the frequency counter 88 is designed to receive the inverted signal of an output signal from the AND circuit 103. Inputted into the AND circuit 103 are the level-inverted signal of an output signal S2 from the clear counter 72 and an output signal RST from the reset signal generating circuit 75. According to this configuration, while a low-level output signal RST (reset signal) is being outputted from the reset signal generating circuit 75, the count value of the frequency counter 88 is being reset to zero times. On the other hand, while a high-level output signal RST is being outputted from the reset signal generating circuit 75, the count value of the frequency counter 88 is being reset to zero times when the clear counter 72 overflows and a high-level output signal S2 (clear signal) is outputted. Accordingly, the clear counter 72 also functions as a frequency reset circuit.

f. Blocking Circuit

As shown in FIG. 5, an OR circuit 68 into which the control signal S1 and the inverted signal of an output signal "Inhibit" are inputted is provided in the control logic unit 27, and the output signal of the OR circuit 68 is inputted into the aforementioned OR circuits 66 and 67. According to this configuration, since a high-level output signal is inputted from the OR circuit 68 when a high-level control signal S1 (off signal) is inputted, even if a low-level first abnormal current signal OC is outputted from the abnormal overcurrent detector 53 or a low-level abnormal temperature signal OT is outputted from the overheat detector 25, the output from the OR circuits 66 and 67 is maintained at high level. That is, the low-level first abnormal current signal OC and the low-level abnormal temperature signal OT are nullified (masked). Accordingly, the OR circuits 66 to 68 function as "blocking circuits".

(Gate Driver)

Into the gate driver 28 are inputted the control signal S1, the second abnormal current signal FC, and the output signal "Inhibit" from the control logic unit 27. The gate driver 28 comprises a charge pump (not shown in the figure) that is connected between the power supply terminal P2 and gates of the power MOSFET 14 and the sense MOSFET 18, and a discharge FET (not shown) that is connected between the gates of the power MOSFET 14 and the sense MOSFET 18 and the source.

Upon receiving a low-level control signal S1 (on signal) from the control logic unit 27, the gate driver 28 drives only a charge pump 90 to provide a voltage that is pressurized to a higher level than the power supply voltage Vcc between the respective gates of the power MOSFET 14 and the sense MOSFET 18 and the source to turn on the MOSFETs to perform a charge operation that causes a conduction operation. On the other hand, upon receiving a high-level control signal S1 (off signal) or a low-level output signal "Inhibit" from the control logic unit 27 (at the time of the above described first and second forced shutoff operations), the gate driver 28 turns off the pressurization operation of the charge pump 90 and, at the same time, turns on only the discharge FET to discharge a charge between the respective gates of the power MOSFET 14 and the sense MOSFET 18 and the source to perform a discharge operation that causes a shutoff operation <Operations of Present Illustrative Aspect>

(Case where an Inrush Current Occurs that is of a Level that Does not Exceed the First Anomaly Threshold Current ILoc that Changes with Time.)

FIG. 7 is a timing chart in a case in which the power supply controller 10 receives a low-level constant voltage signal as the control signal S1. First, upon receiving the low-level control signal S1 an internal ground GND2 is generated at the internal ground generator 23. When this internal ground GND2 becomes stable, a high-level output signal RST is outputted from the reset signal generating circuit 75 to release each of counters 71 to 73 and 88 from the reset state.

Further, the low-level control signal S1 is provided to the gate driver 28 to turn on the power MOSFET 14 and the like to place it in a conduction state. At this time, an inrush current that is higher than the second anomaly threshold voltage ILfc flows to the power MOSFET 14. However, since the first anomaly threshold current ILoc is at an initial level that is higher than the inrush current, it is possible to prevent the above described first forced shutoff operation being performed at the power MOSFET 14 (and the like) due to this inrush current.

Further, due to the inrush current occurring and the load current IL exceeding the second anomaly threshold voltage ILfc, the fuse time counter 73 starts a count-up operation. That counter value is accumulated until the load current IL falls below the second anomaly threshold voltage ILfc, and the first anomaly threshold current ILoc changes with time to a low level. According to the present illustrative aspect, at a point in time when the load current IL exceeds the second anomaly threshold voltage ILfc, the count of counter value of the frequency counter 88 is incremented by one time.

Thereafter, at a time when the load current IL falls below the second anomaly threshold voltage ILfc, the above described initialization operation is executed in which the second anomaly threshold voltage ILfc is returned to the initial level by the accumulated time of the fuse time counter 73 being reset. Subsequently, when a normal state in which the load current IL is less than the second anomaly threshold voltage ILfc (refer to "normal state" in FIG. 7) and continues for the above described reference normal time, the clear counter 72 overflows and the count value of the frequency counter 88 is reset.

In this case, for example, when a configuration is adopted in which a separate switching element is provided on the downstream side (load 11 side) of the power MOSFET 14 in the conduction channel 13 and this switching element is turned on and off multiple times at predetermined time intervals (time intervals greater than or equal to the reference normal time) in a state in which the power MOSFET is on, an inrush current occurs multiple times. Even in this case, the first anomaly threshold current ILoc is returned to the initial level at the occurrence of each inrush current, and it is possible to prevent the power MOSFET 14 (or the like) from performing the first forced shutoff operation by each inrush current.

Next, for example, in a case in which the load 11 short-circuits or the like and an abnormal current occurs, a count-up operation of the fuse time counter 73 starts from the initial value at the time that the load current IL exceeds the second anomaly threshold voltage ILfc, and the first anomaly threshold current ILoc again changes to a low level with time. Further, at this time, the count of the counter value of the frequency counter 88 is incremented by one time. When the load current IL at this abnormal time exceeds the first anomaly threshold current ILoc, the power MOSFET 14 (or the like) executes the first forced shutoff operation. As a result, the load current IL falls below the second anomaly threshold voltage ILfc and at this time the above described initialization operation is executed.

Subsequently, when the shutoff time counter 71 overflows after execution of the above described first forced shutoff operation (after the reference shutoff time period elapsed), the power MOSFET 14 (and the like) are returned to a conduction state. As long as this abnormal current state continues, the first forced shutoff operation and subsequent return to the conduction state are repeated (see "OC chopping period" in FIG. 7). During this period, until before the initialization operation is repeated seven times (the frequency counter 88 counts eight times), each time the initialization operation is executed the accumulated time of the fuse time counter 73 is reset and the first anomaly threshold current ILoc is returned to the initial level.

Thereafter, after the initialization operation is repeated seven times (the frequency counter 88 counts eight times), the initialization operation is made non-executable, and the operation changes to OC chopping at a low level to which the first anomaly threshold current. ILoc is decreased with time. Therefore, an overcurrent state can be detected by this low first anomaly threshold current ILoc. When this overcurrent or fuse current continues and the fuse time counter 73 overflows, the second forced shutoff operation is performed at the power MOSFET 14 (or the like).

In this case, the second anomaly threshold voltage ILfc is taken as being at a level that is somewhat higher than the rated current ILmax of the load 11. The reference fuse time is set to a time that is shorter than the time until the wire 30 produces smoke in a case where a fuse current that exceeds the second anomaly threshold voltage ILfc is intermittently detected at a time interval that is shorter than the reference normal time. Consequently, a chattering short in which a stranded wire of one part of the wire 30 short-circuits and an abnormal current flows to only the stranded wire of that one part in a time interval that is shorted than the above described reference normal time can be detected before the wire 30 starts to produce smoke, and the power MOSFET 14 can be made to perform the second forced shutoff operation.

In a holding state of the above described second forced shutoff operation, at the clear counter 72 the counter value is reset during a period in which a low-level control signal S1 is being received, and the clear counter 72 is placed in a state in which a low-level output signal S2 is outputted. Accordingly, as long as the low-level control signal S1 is being inputted the counter value of the fuse time counter 73 is placed in a state in which it is not reset (see "shutoff hold (latch)" in the same figure). Subsequently, when the power supply controller 10 receives a high-level control signal S1 (off signal), the clear counter 72 starts a count-up operation.

In this case, at the internal ground generator 23, although the FET 41 is turned off when the high-level control signal S1 is received, when the low-level output signal S2 is received the FET 42 is turned on and the conduction state is continued. Accordingly, for example, even in a case where the driver performs an operation to input the high-level control signal S1 (off signal) after the above described second forced shutoff operation is performed, and immediately thereafter performs an operation to input the low-level control signal S1 (on signal), if that time interval is within the reference normal time the above described second forced shutoff operation state can be held.

On the other hand, when the high-level control signal S1 (off signal) is inputted continuously to the input terminal P1 for the reference normal time, the clear counter 72 overflows and the high-level output signal S2 is provided to the internal ground generator 23 to stop the conduction. Accordingly, thereafter, a dark current from the power source 12 flows to the ground via the internal ground generator 23 and lowering of the charged capacity of the power source 12 (vehicle battery) can be prevented. At this time, a low-level output signal RST is outputted from the reset signal generating circuit 75, and the count value of each counter 71 to 73 and 88 is reset thereby. Further, when the low-level output signal RST is outputted, since the FET 101 turns off upon receipt of this low-level output signal RST and a high-level holding circuit 100 functions to fix the output signal S2 at a high level, even if the count value of the clear counter 72 is reset, generation of the internal ground GND2 by the internal ground generator 23 is turned off.

(Case where an Inrush Current Occurs that Exceeds the First Anomaly Threshold Current ILoc that Changes with Time.)

As described in the foregoing, in order to avoid self-destruction by the power MOSFET 14, it is necessary to set the level that changes with time of the first anomaly threshold current ILoc within the reference fuse time in a region where the current level is lower than the self-destruction characteristic curve L2. Further, to avoid (as much as possible) a forced shutoff operation caused by a high level inrush current, it is preferable to set the initial level of the first anomaly threshold current ILoc as high as possible. Accordingly, in order to satisfy these conditions, according to the present embodiment, as shown in FIG. 4, the self-destruction characteristic curve L2 is set to as low a level as possible while, at the same time, making the level that changes with time of the first anomaly threshold current ILoc within the reference fuse time follow along the self-destruction characteristic curve L2.

However, for example, in some cases an inrush current occurs that changes with a more moderate slope than the changes shown in FIG. 4 that are assumed at the design stage because the load resistance at load, start-up increases (i.e. due to irregularities in manufacture of the components or the like). More specifically, for example, in a case where the load 11 is a cooling fan motor or a wiper motor, when snow (or the like) accumulates on the cooling fan or wiper or ice attaches thereto to increase the load resistance, the change with time in the inrush current becomes moderate (the time constant lengthens).

Figure 8:
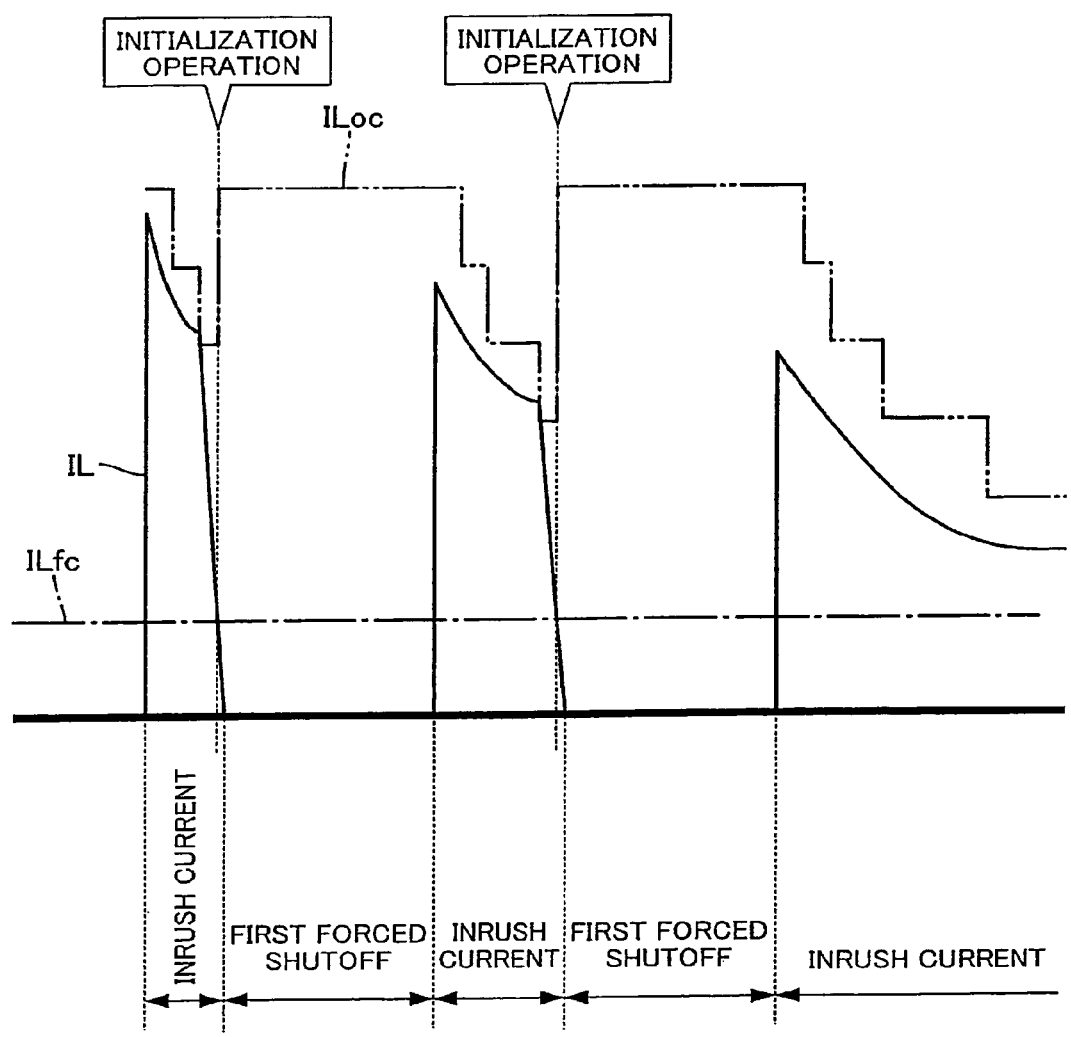
FIG. 8 is a timing chart illustrating a case in which an inrush current occurs that exceeds a first anomaly threshold current.

In this type of case, for example as shown in FIG. 8, there are times in which the inrush current that occurs exceeds the first anomaly threshold current ILoc for which the level gradually decreases with time. In such case, although the power supply controller 10 of the present illustrative aspect causes the power MOSFET 14 to perform a first forced shutoff operation, at that time point an initialization operation is executed that returns the first anomaly threshold current ILoc to the initial level. Subsequently, if an inrush current occurs again when the power MOSFET 14 has returned to a conduction state after the above described first forced shutoff operation, an initialization operation is executed once more. When this kind of initialization operation is repeated to some extent the load resistance of the load 11 is gradually reduced by the intermittent conduction, and after conduction, it is possible to instantly break out from the state of repeating a forced shutoff operation and start normal power supply control to the load 11.

Figure 9:
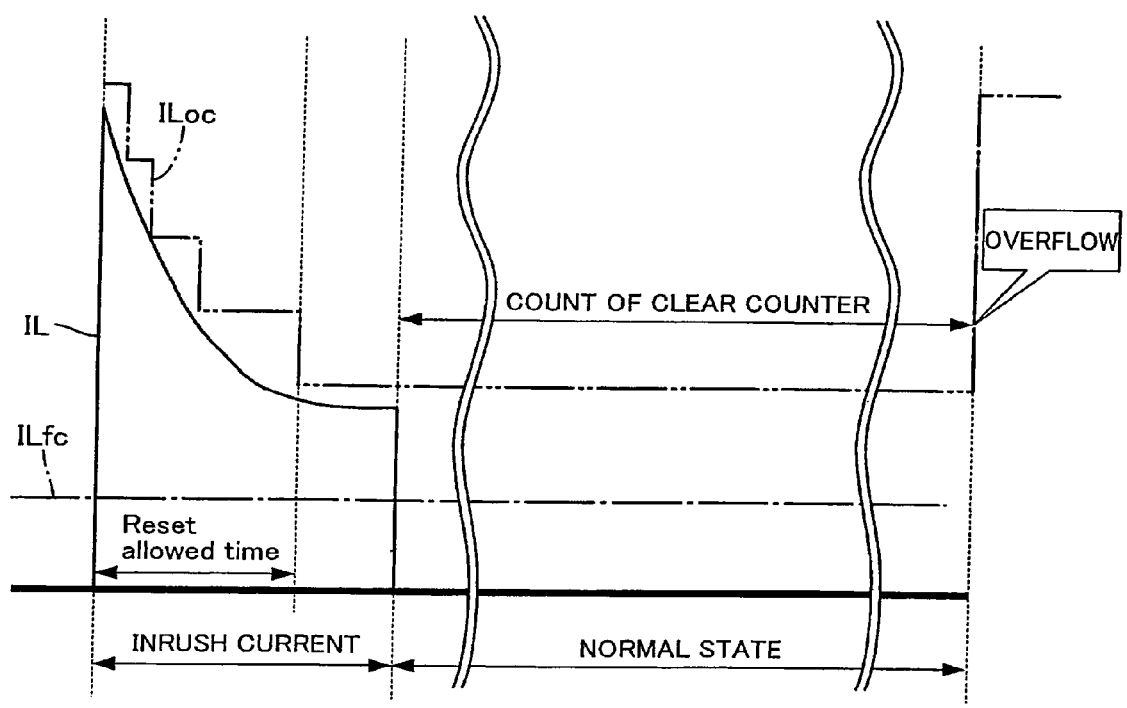
FIG. 9 is a timing chart illustrating a case in which an inrush current occurs that, while not exceeding a first anomaly threshold current, changes very gently.
Figure 10:
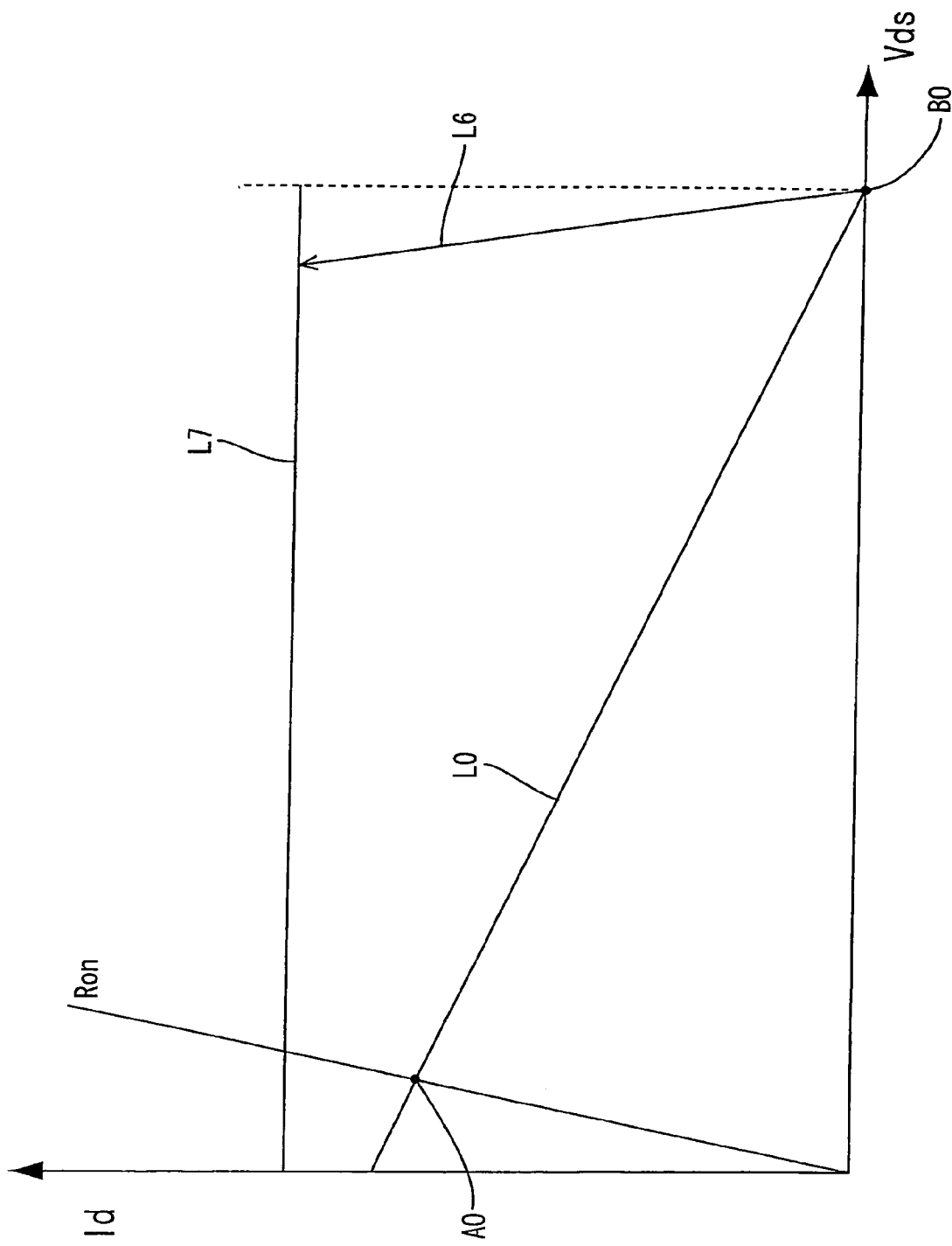
FIG. 10 is an explanatory drawing for describing a problem point in a case in which a threshold is fixedly set at a constant level.

Further, as shown in FIG. 9, in some cases an inrush current may occur in which a level that does not exceed the first anomaly threshold current ILoc but exceeds the second anomaly threshold voltage ILfc continues for a comparatively long time period. In this case, even when the inrush current falls thereafter to enter a normal state in which the load current IL is below the second anomaly threshold voltage ILfc, if the amount of the accumulated time of the fuse time counter 73 is already greater than or equal to the above described reset allowed time at that time point, an initialization operation is not executed. That is, while accumulating the amount of fuse time without resetting the amount of accumulated time of the fuse time counter 73 that was accumulated up to that point, overcurrent detection is performed using the low first anomaly threshold current ILoc that has decreased in level. This is because, in a case like this in which the amount of fuse time of the fuse time counter 73 is accumulated to some extent, it is preferable to preferentially execute a fuse function (external circuit protection function). As shown in FIG. 9, after the inrush current has subsided, the clear counter 72 overflows when the normal state has continued for the reference normal time. As a result, the accumulated time of the fuse time counter 73 is reset, whereby the first anomaly threshold current ILoc is returned to the initial level.

(Surge Countermeasure at Input of Off Signal)

When a high-level control signal S1 (off signal) is inputted and the power MOSFET 14 turns off, the source voltage of the power MOSFET 14 is pulled to the load side by the surge voltage of the load 11 as the L load. As a result, the first anomaly threshold voltage Voc and the second anomaly threshold voltage Vfc that are regenerated based on this source voltage become negative voltages, and despite the fact that an over current or fuse current is not occurring, a low-level first abnormal current signal OC or a low-level second abnormal current signal FC is outputted as an abnormal signal from the abnormal overcurrent detector 53.

As a result, in a configuration in which the above described blocking circuit is not provided, a problem arises that a first forced shutoff operation that shuts off the power MOSFET 14 for the reference shutoff time period is executed by the shutoff time counter 71, and even if a low-level control signal S1 (on signal) is inputted within that reference shutoff time period, the power MOSFET 14 cannot be made to carry out a conduction operation. However, according to the present illustrative aspect, since input of a low-level first abnormal current signal OC is nullified by the above described OR circuits 66 and 68 and a state in which a high-level signal is inputted into the set terminal of the shutoff time counter 71 is maintained, execution of the above described first forced shutoff operation can be blocked.

Further, in a configuration in which the above described blocking circuit is not provided, when a low-level first abnormal current signal OC or a low-level second abnormal current signal FC is outputted as an abnormal signal from the abnormal overcurrent detector 53, a count operation of the fuse time counter 73 starts. Subsequently, a problem arises that, the fuse time counter 73 overflows because a malfunction is repeated in which a low-level control signal S1 is inputted and the power MOSFET 14 performs a conduction operation and a low-level first abnormal current signal OC or a low-level second abnormal current signal FC is again outputted within a reference normal time, and despite the fact that the state is not a fuse current state, the above described second forced shutoff operation is executed. However, according to the present illustrative aspect, since input of a low-level second abnormal current signal FC is nullified by the above described OR circuits 67 and 68 and input of the clock signal CLK1 to the fuse time counter 73 is stopped so that a count-up operation is not performed, execution of the above described second forced shutoff operation can be blocked.

As a surge countermeasure at input of an off signal, although a method may also be considered in which the bias of the first anomaly threshold voltage Voc and the anomaly threshold voltage Vfc is increased to the limit at the threshold voltage generator 52, in that case there is a risk that a problem will arise in which the first anomaly threshold voltage Voc and the second anomaly threshold voltage Vfc are affected by a bias voltage and are no longer capable of showing values that are proportional to the source voltage of the power MOSFET 14, and also that detection of each abnormal current will be delayed. Therefore, a configuration such as that of the present illustrative aspect is preferable.

<Other Illustrative Aspects>

The present invention is not limited to the illustrative aspects described above and in the drawings. For example, the technical scope of the present invention also includes the following illustrative aspects.

(1) Although the power MOSFET 14 is utilized as a switching element in the above described illustrative aspects, the present invention is not limited thereto, and the switching element may be another unipolar transistor or a bipolar transistor.

(2) Although a so-called "sense technique" which utilizes the sense MOSFET 18 as a current detecting element is employed in the above described illustrative aspects, the present invention is not limited thereto, and for example, a so-called "shunt technique" may be employed in which a shunt resistor is provided in a conduction channel and a load current is detected based on the amount of voltage drop.

(3) A configuration may be adopted which does not utilize the counter circuit that is used in the above described illustrative aspects as a threshold changing circuit, and instead, for example, generates a first threshold based on the terminal voltage of an RC parallel circuit and gradually reduces the first threshold with time by gradually discharging the charge of this capacitor with time. Further, the configuration may be one in which a threshold voltage is not changed.

(4) Although the configuration described above is one that counts only the amount of time of an abnormal state of the fuse time counter 73, a configuration may also be adopted which accumulates an amount of time including the amount of time of a normal state.

(5) Although in the above described illustrative aspects a configuration is adopted that reduces the level of the first anomaly threshold current ILoc in accordance with the accumulated amount of time of the fuse time counter 73 that is utilized for the fuse function, the present invention is not limited thereto, and a configuration may be adopted that reduces the level in accordance with the accumulated amount of time of a time counter other than the fuse time counter 73.

(6) Although the above described illustrative aspects describe an example which is configured by a voltage divider circuit 60 that divides a source voltage of the power MOSFET 14 as a voltage generator circuit, the present invention is not limited thereto. For example, the configuration may be one in which the output voltage (source voltage) of the switching element is inputted to a control terminal, and a switching element is provided that is connected to a resistive circuit element on the output side, and by flowing a current that corresponds to the source voltage to the resistive circuit element, a terminal voltage of the resistive circuit element is generated as a voltage that corresponds with the output voltage of the switching element.

What is claimed is:

1. A power supply controller, comprising:
   a switching element that is disposed between a power source and a load, the load being an inductive load;
   a current detecting element that is connected in parallel to the switching element and outputs a detection signal corresponding to a load current that flows to the switching element;
   a voltage generator circuit that generates a generation voltage that corresponds to an output voltage across the load;
   an anomaly detecting circuit that, when a voltage corresponding to the detection signal exceeds the generation voltage, outputs an abnormal signal;
   a protection circuit that performs a predetermined protection operation based on the abnormal signal that is outputted from the anomaly detecting circuit, the protection circuit forcing the switching element to shut off and be kept in a shutoff state for a predetermined reference shutoff time period, as the predetermined protection operation;
   a control circuit into which an on signal and an off signal are inputted, and which turns on the switching element based on input of the on signal and turns off the switching element based on input of the off signal; and
   a blocking circuit that blocks execution of the predetermined protection operation by the protection circuit when the off signal is inputted and the voltage corresponding to the detection signal exceeds the generation voltage.

2. The power supply controller according to claim 1, wherein the blocking circuit has a configuration that, when the off signal is inputted, nullifies the abnormal signal from the anomaly detecting circuit to block execution of the protection operation by the protection circuit.

3. The power supply controller according to claim 1, wherein the protection circuit has a configuration that, when the abnormal signal is outputted, after causing the switching element to perform a shutoff operation for a reference shutoff time period, turns on the switching element as the protection operation.

4. The power supply controller according to claim 1, wherein,
   the protection circuit comprises an anomaly time accumulating circuit that, when the abnormal signal is outputted, starts to accumulate an amount of anomaly time, and causes the switching element to perform a shutoff operation as the protection operation when the amount of anomaly time reaches a reference anomaly time, and
   a normal time accumulating circuit that, after the anomaly time accumulating circuit starts to accumulate the amount of anomaly time, accumulates an amount of normal time in which the load current is continuously at or below a normal level that is less than the threshold current, and clears the amount of anomaly time of the anomaly time accumulating circuit when the amount of normal time reaches a reference normal time.

5. A power supply controller, comprising:
   a switching element that is disposed between a power source and a load the load being an inductive load;
   a current detecting element that is connected in parallel to the switching element and is capable of outputting a detection signal in the form of a load current to the switching element;
   a voltage generator circuit that is capable of generating a generation voltage that corresponds to an output voltage across the load;
   an anomaly detecting circuit that is capable of outputting an abnormal signal when a voltage corresponding to the detection signal exceeds the generation voltage;
   a protection circuit that is capable of performing a predetermined protection operation based on the abnormal signal that is outputted from the anomaly detecting circuit, the protection circuit forcing the switching element to shut off and be kept in a shutoff state for a predetermined reference shutoff time period, as the predetermined protection operation;
   a control circuit that is capable of receiving an on signal and an off signal, wherein the control circuit turns on the switching element when receiving the on signal and turns off the switching element when receiving the off signal; and
   a blocking circuit that is capable of blocking the predetermined protection operation when the off signal is received and the voltage corresponding to the detection signal exceeds the generation voltage.

6. The power supply controller according to claim 5, wherein the outputting of the abnormal signal from the anomaly detecting circuit is also based upon the detection signal.

7. The power supply controller according to claim 5, wherein when the off signal is received, the blocking circuit is capable of nullifying the abnormal signal to block execution of the predetermined protection operation.

8. The power supply controller according to claim 5, wherein when the abnormal signal is outputted, after causing the switching element to perform the shutoff operation for the reference shutoff time period, the protection circuit is capable of turning on the switching element.

9. The power supply controller according to claim 5, wherein the protection circuit includes an anomaly time accumulating circuit that starts to accumulate an amount of anomaly time when the abnormal signal is outputted.

10. The power supply controller according to claim 9, wherein the protection circuit causes the switching element to perform the shutoff operation as the protection operation when the amount of anomaly time reaches a reference anomaly time.

11. The power supply controller according to claim 10, further including a normal time accumulating circuit that, after the anomaly time accumulating circuit starts to accumulate the amount of anomaly time, accumulates an amount of normal time in which the load current is continuously at or below a normal level that is less than the output voltage.

12. The power supply controller according to claim 11, wherein the normal time accumulating circuit clears the amount of anomaly time of the anomaly time accumulating circuit when the amount of normal time reaches a reference normal time.

* * * * *